(12) United States Patent
Bablee et al.

(10) Patent No.: US 6,391,138 B1
(45) Date of Patent: May 21, 2002

(54) METHOD OF FABRICATING A LAMINATED CIRCUIT ASSEMBLY AND PRODUCT THEREOF

(75) Inventors: Bruno Bablee, Ménil (FR); Michael Malone, Naperville, IL (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 09/399,824

(22) Filed: Sep. 20, 1999

(51) Int. Cl.[7] ................................................ B32B 31/18
(52) U.S. Cl. ...................... 156/253; 156/252; 156/250; 156/256; 156/263; 428/136; 428/192; 428/43
(58) Field of Search ................................ 428/136, 192, 428/43; 156/253, 252, 250, 256, 263

(56) References Cited

U.S. PATENT DOCUMENTS

| | | | | |
|---|---|---|---|---|
| 3,230,649 A | * | 1/1966 | Karn | 40/2 |
| 4,446,183 A | * | 5/1984 | Savagian | 40/638 |
| 5,021,274 A | * | 6/1991 | Beck et al. | 206/459.5 |
| 5,460,681 A | * | 10/1995 | Horner | 156/183 |
| 5,631,055 A | * | 5/1997 | Vines et al. | 118/504 |

* cited by examiner

*Primary Examiner*—William P. Watkins, III
(74) *Attorney, Agent, or Firm*—Stephen Z. Weiss

(57) ABSTRACT

A method of fabricating a laminated circuit assembly and the assembly made therefrom including the steps of providing a relatively stiff substrate. A U-shaped slit is cut in the substrate in an area where a peripheral pull tab subsequently is to be located. The side legs of the U-shaped configuration define spaced slit portions. A relatively flexible backing sheet is adhered to a back side of the substrate. The laminated substrate and backing sheet are cut with a peripheral cut intersecting the side legs of the U-shaped slit, with the peripheral cut forming a pull tab projecting outwardly from the U-shaped slit. The pull tab can be grasped and separated from the substrate to strip the backing sheet therefrom.

15 Claims, 8 Drawing Sheets

METHOD OF FABRICATING A LAMINATED CIRCUIT ASSEMBLY AND PRODUCT THEREOF

FIELD OF THE INVENTION

This invention generally relates to the art of electrical circuitry and, particularly, to a method of fabricating a laminated circuit assembly, such as an assembly for adhering to the face of a control panel of an electrical appliance.

BACKGROUND OF THE INVENTION

Laminated circuit assemblies are used in a wide variety of applications. For instance, such circuit assemblies are used in laminated electrical switches which sometimes are called membrane or "touch" switches. A membrane switch may include an insulative substrate or circuit sheet, such as of plastic material, which mounts or supports thin conductive contacts, such as printed circuitry. A flexible membrane is laminated to the substrate. In a normally open membrane switch, a spacer layer often is sandwiched between the membrane and the substrate, with an aperture in the spacer layer aligned with the contacts. When the flexible membrane is depressed in the area of the aperture in the spacer layer, it flexes such that a contact on the membrane engages the contacts on the substrate to close the switch.

Laminated circuit assemblies, such as laminated electrical switches as described above, often are adhered to the face of a control panel of an electrical appliance, such as household appliances. In these applications, the back side of a substrate or circuit sheet has an adhesive film applied thereto, and a flexible backing sheet is adhered to the adhesive. When it is desired to apply the circuit or switch assembly to the face of the control panel of the electrical appliance, the backing sheet is stripped from the substrate to expose the adhesive on the back side of the substrate. In order to facilitate stripping the backing sheet, a pull tab is formed out of the substrate and remains adhered to the flexible backing sheet so that the backing sheet can be easily grasped and stripped. Problems often are encountered in forming the pull tab from the substrate so that the pull tab is easily separated from the substrate to facilitate stripping the flexible backing sheet.

In particular, the various sheets or layers of the laminated circuit assembly are cut to their desired shapes or configurations in stamping-type cutting operations. In order to be able to separate the pull tab from the remainder of the substrate or circuit sheet, a cut or slit must be stamped which will define and separate the pull tab from the substrate. This cut must not cut through the backing sheet or else the pull tab would separate from the backing sheet when pulled, rendering the pull tab useless for the purpose of stripping the backing sheet from the substrate. Positioning the cutting blade such that it will reliably cut completely through the substrate but not through the backing sheet is very difficult. This difficulty can result in the production of many assemblies that are out of specification, thereby increasing scrap cost. The present invention is directed to solving these problems.

SUMMARY OF THE INVENTION

An object, therefore, of the invention is to provide a new and improved method of fabricating a laminated circuit assembly of the character described.

Another object of the invention is to provide a method of fabricating a laminated circuit assembly for adhering to the face of a control panel of an electrical appliance, for instance.

In the exemplary embodiment of the invention, the method includes the steps of providing a plastic circuit sheet with electrical circuitry printed thereon. A slit is cut in the circuit sheet in an area where a pull tab subsequently is to be located. An adhesive is deposited on a back side of the circuit sheet, and a backing sheet is adhered thereto. The resulting laminated circuit sheet and backing sheet are cut with a peripheral cut around the circuitry. The peripheral cut intersects the slit with the cut forming a pull tab projecting outwardly from the slit. Therefore, the pull tab can be grasped and separated from the circuit sheet to strip the backing sheet from the circuit sheet when it is desired to adhere the circuit sheet to the face of the control panel.

The slit is preferably U-shaped with the side legs of the U-shaped configuration defining spaced slit portions. The peripheral cut intersects the side legs of the U-shaped slit. The U-shaped slit is cut so that the side legs of the U-shaped configuration project outwardly.

As disclosed herein, the backing sheet is provided of flexible material. The circuit sheet is of a material more rigid or stiff than the backing sheet. The invention is disclosed herein in a laminated electrical switch which includes a switch sheet adhered to the front side of the circuit sheet. A spacer layer is positioned between the switch sheet and the circuit sheet.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
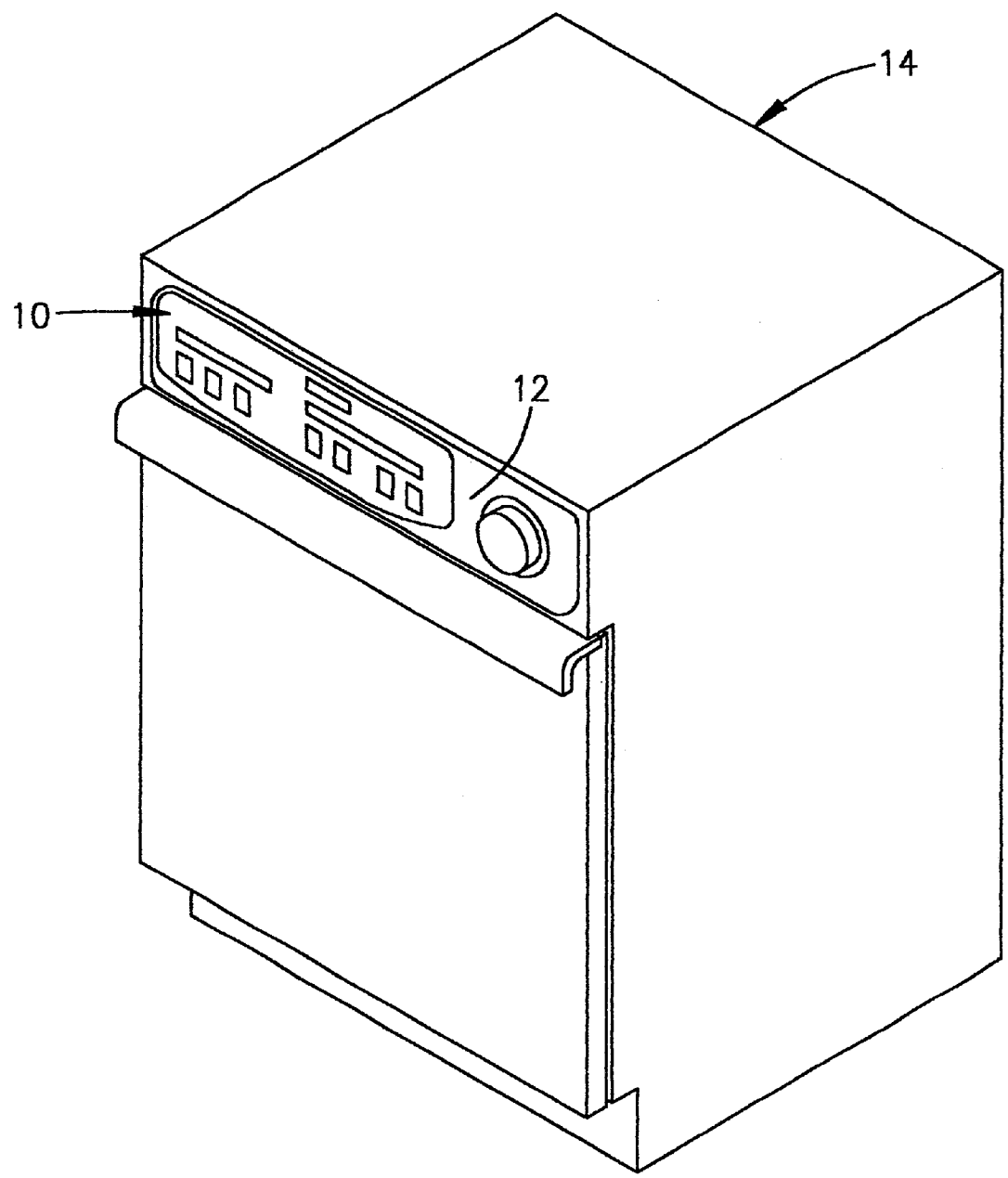
FIG. 1 is a perspective view of an electrical appliance having a laminated electrical switch fabricated according to the invention adhered to the face of a control panel of the appliance.

Referring to the drawings in greater detail, and first to FIG. 1, the invention is embodied in a method of fabricating a laminated circuit assembly in the form of a laminated electrical switch assembly, generally designated 10, which is adhered to the face of a control panel 12 of an electrical appliance, generally designated 14. The appliance may be a dishwasher, a clothes washer, a clothes dryer or similar household appliance. However, it should be understood that the invention is not limited to such applications. In addition, the method of fabricating a laminated circuit assembly according to the invention is not limited to laminated electrical switch assemblies 10.

Figure 2:
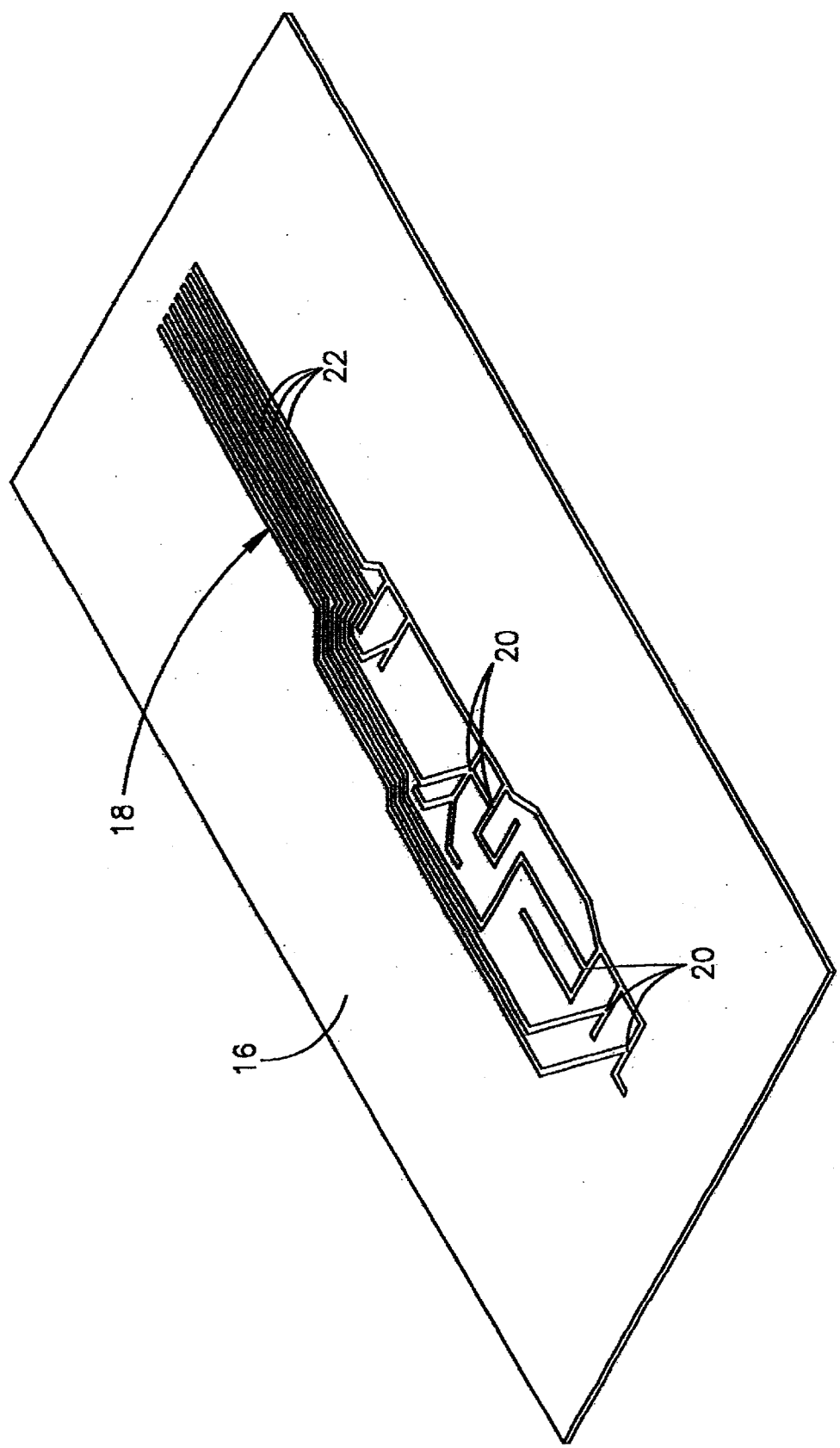
FIG. 2 is a perspective view of the circuit sheet or substrate.

FIGS. 2–8 represent various steps in the fabricating method of the invention. More particularly, FIG. 2 shows a circuit sheet or substrate 16 of relatively stiff plastic material. The substrate has electrical circuitry, generally designated 18, printed thereon. The term "printed" circuitry herein is meant in its broadest sense. Circuitry 18 can be applied to substrate 16 in a variety of processes other than literally printing the circuitry onto the substrate. In any event, the circuitry is formed by thin conductors including contact areas 20 and leads 22 which are connected to various operative components of appliance 14 whereby the circuitry can control operation of the appliance.

Figure 3:
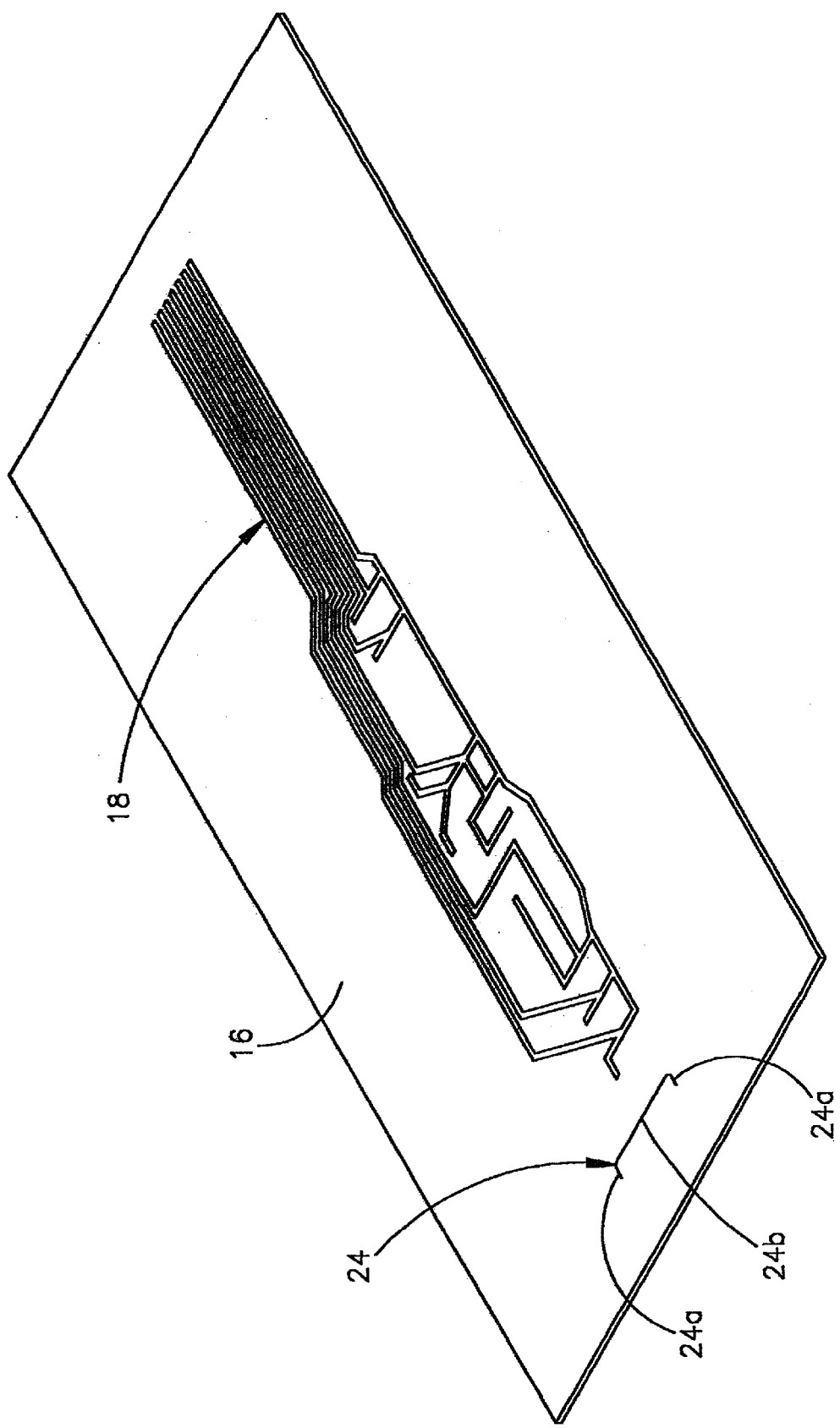
FIG. 3 is a view similar to that of FIG. 2, with the preliminary slit cut in the circuit sheet.

After providing circuit sheet or substrate 16 as described above, a slit, generally designated 24, is cut or stamped in substrate 16 as seen in FIG. 3. The slit is made in an area where a pull tab subsequently is to be located, as will be seen hereinafter. The slit 24 is preferably U-shaped to define a pair of spaced, parallel side legs or slits 24a joined by a cross slit 24b. Legs 24a project outwardly away from circuitry 18.

Figure 4:
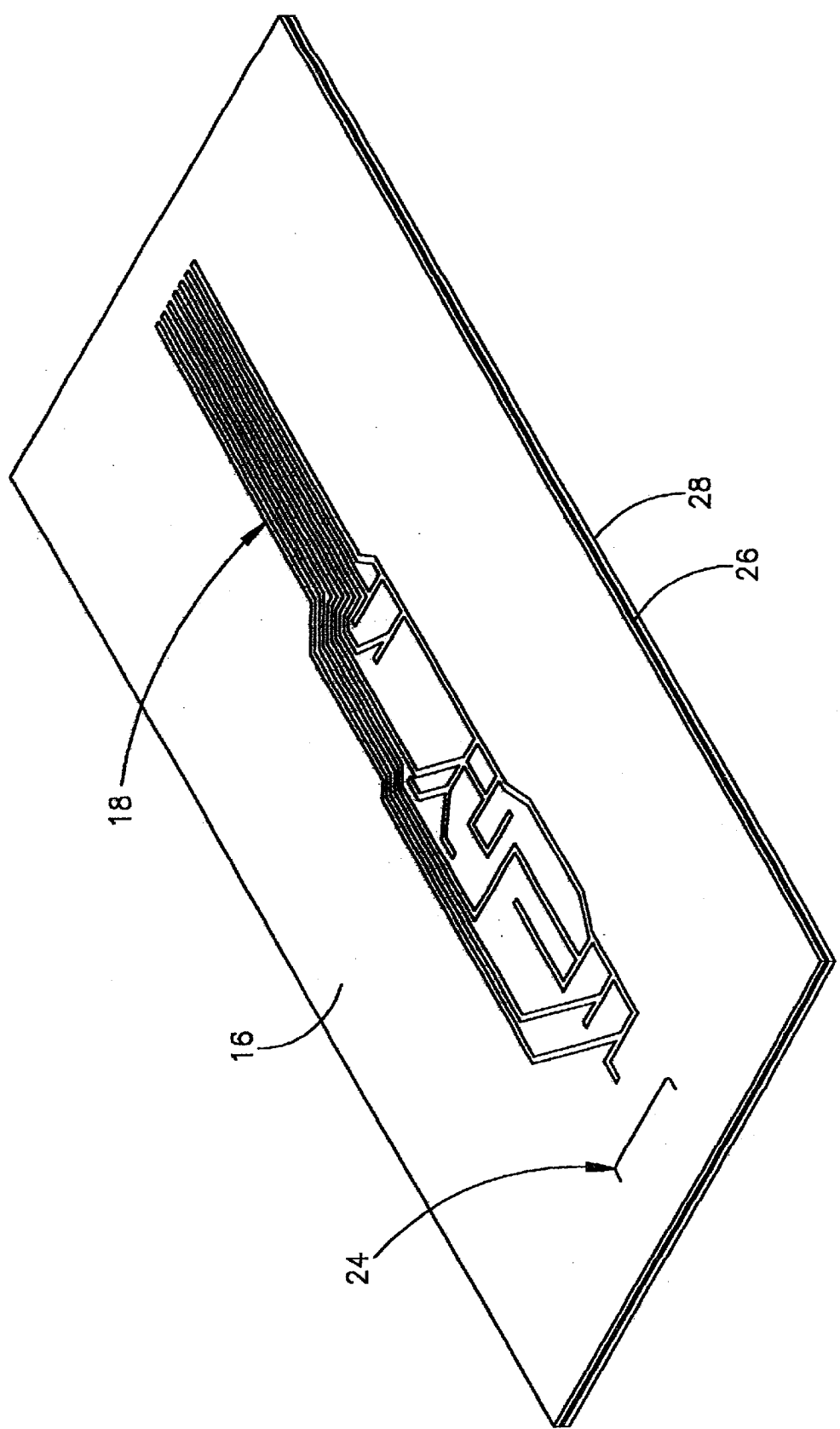
FIG. 4 is a view similar to that of FIG. 3, with a backing sheet adhered to the back side of the circuit sheet.

FIG. 4 shows the next step in the method of the invention, wherein an adhesive layer 26 is applied to a back side of circuit sheet 16 for subsequent adherence to the face of control panel 12 (FIG. 1). A backing sheet 28 is applied over adhesive layer 26 as sort of a "release sheet" to allow handling of the assembly prior to adherence to the appliance. The backing sheet also may be of plastic material, but of a relatively flexible material in comparison to circuit sheet 16 which is of a more rigid or stiff material.

Figure 5:
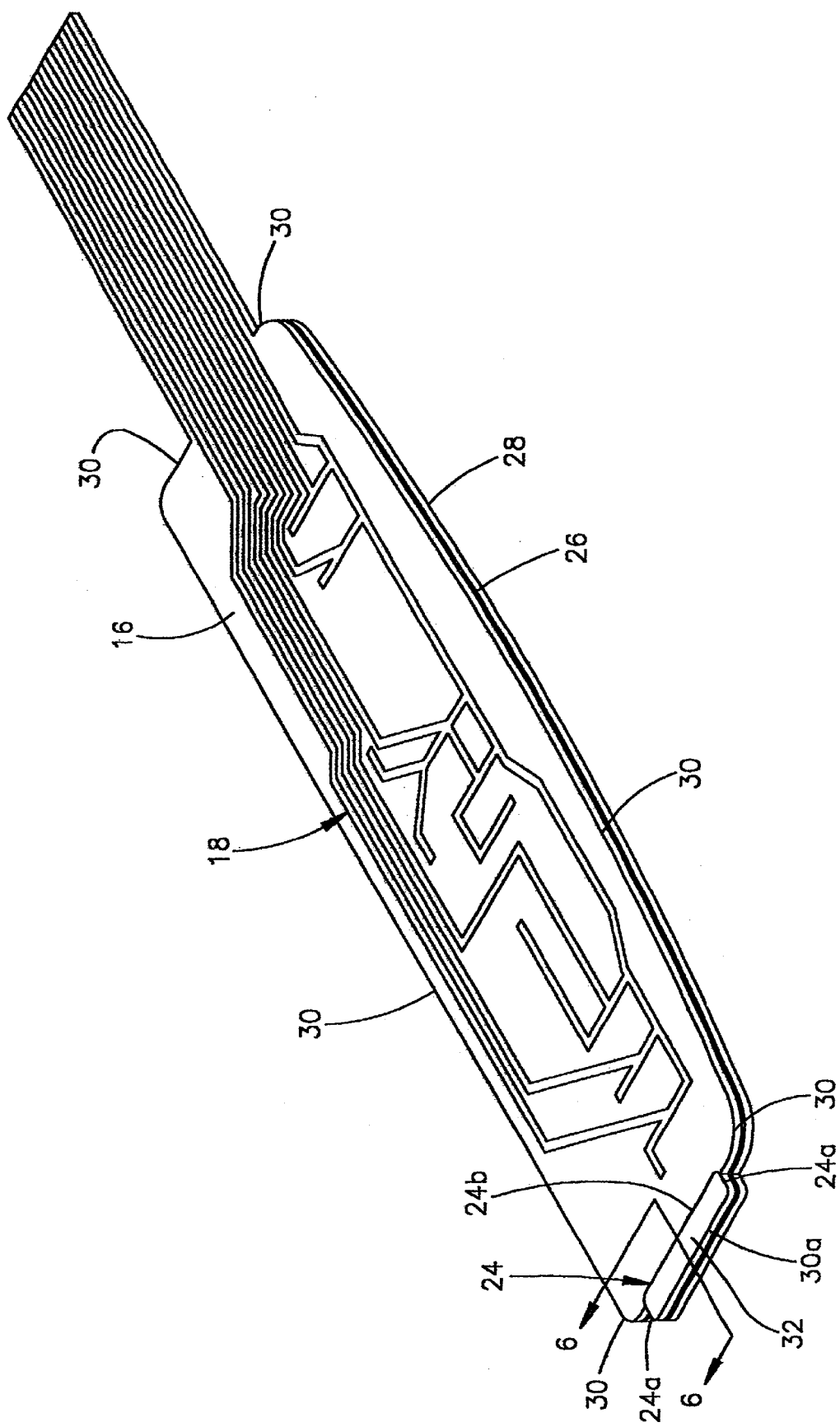
FIG. 5 is a view of the circuit sheet and backing sheet having been cut with the final peripheral cut and forming the pull tab.
Figure 6:
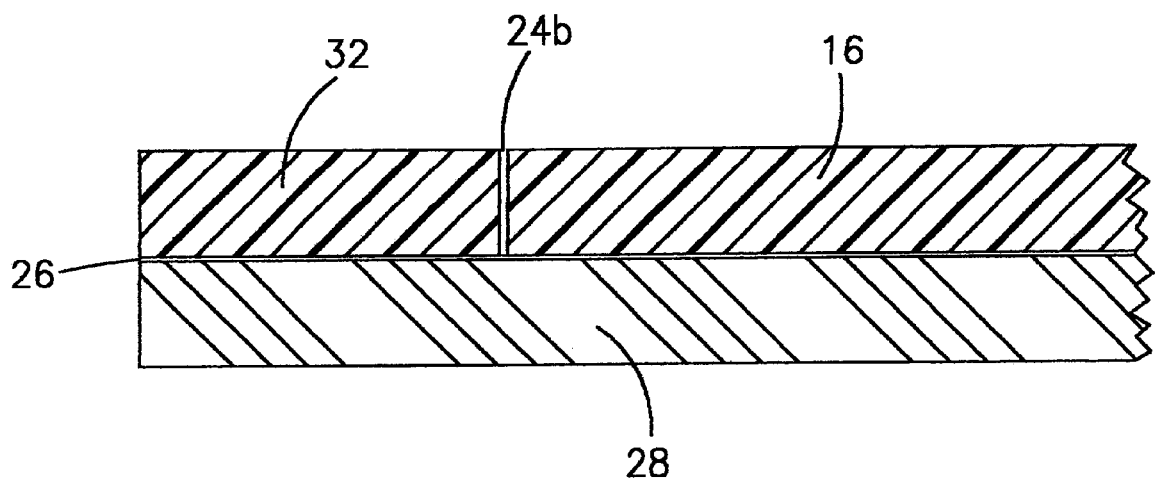
FIG. 6 is an enlarged, fragmented vertical section taken generally along 6—6 of FIG. 5.

FIGS. 5 and 6 show the next step in the method of the invention whereby the now laminated circuit sheet 16 and backing sheet 28 are cut or stamped with a peripheral cut 30 defining a peripheral edge around circuitry 18 and in the final shape or configuration of the laminated circuit assembly. It should be noted that peripheral cut 30 intersects the slit 24. Peripheral cut 30 also is configured at 30a to define an outwardly projecting pull tab 32 cut completely thereabout and out of circuit sheet 16. Since slit 24 was made only in circuit sheet 16 and not backing sheet 28, pull tab 32 now has become separated from the circuit sheet and adhered to the backing sheet.

In a preferred embodiment, the peripheral cut 30 intersects side legs 24a of the U-shaped slit 24. It should be understood that by having peripheral cut 30 intersect side legs or slit portions 24a of U-shaped slit 24, complete communication between the two cuts is easily achieved without much precision because the peripheral cut can intersect slit 24 anywhere along the length of slit portions 24a. This is in contrast to making the preliminary and final cuts by attempting to align two linear cut portions which would require much precision to prevent misalignment and the formation of webs joining the pull tab to the circuit sheet. Such webs would cause difficulty in separating the pull tab from the circuit sheet 16 when it is desired to strip backing sheet 28 from the circuit sheet.

Figure 7:
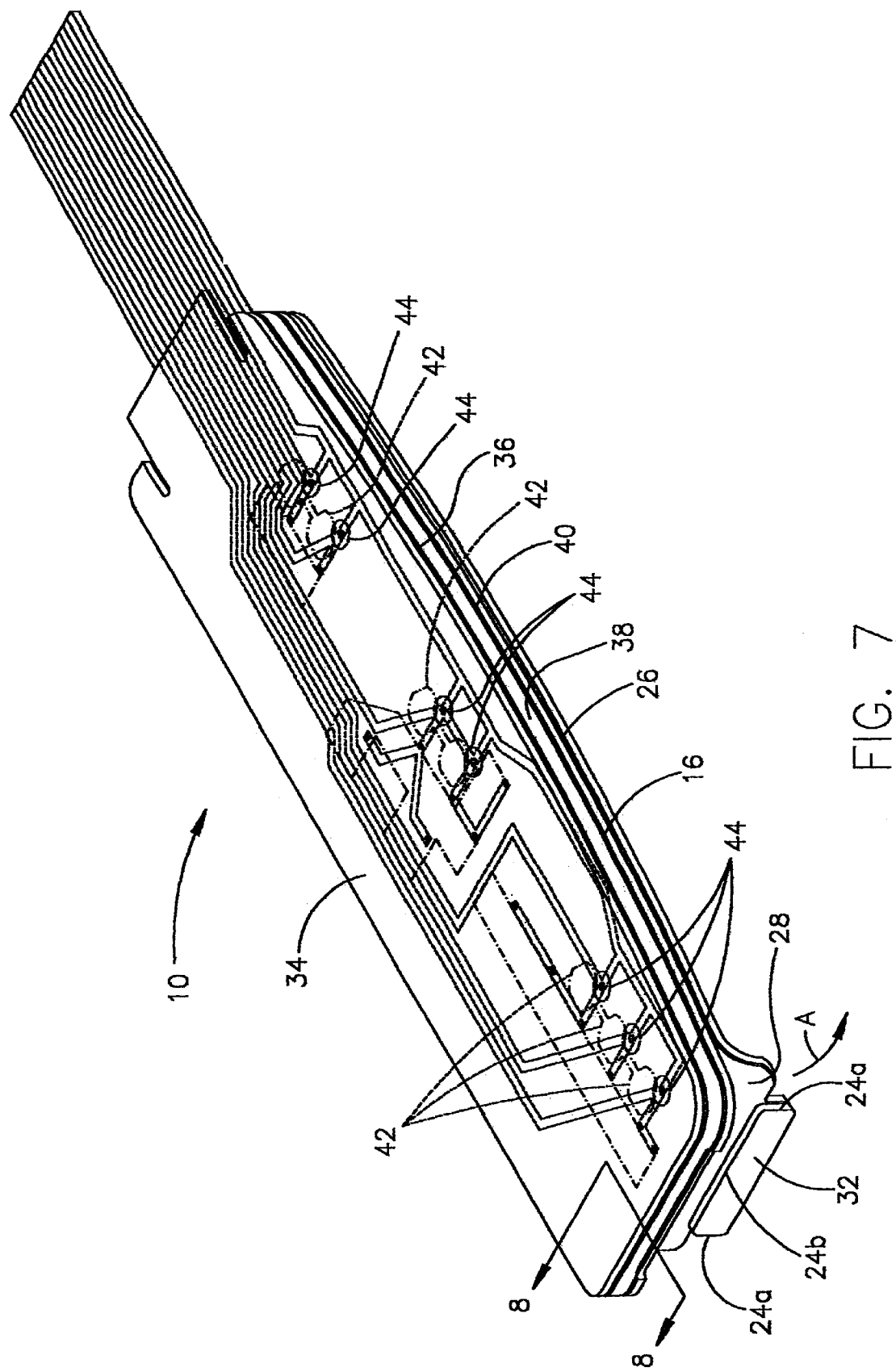
FIG. 7 is a view similar to that of FIG. 5, with the switch sheet and spacer layer adhered to the front side of the circuit sheet.
Figure 8:
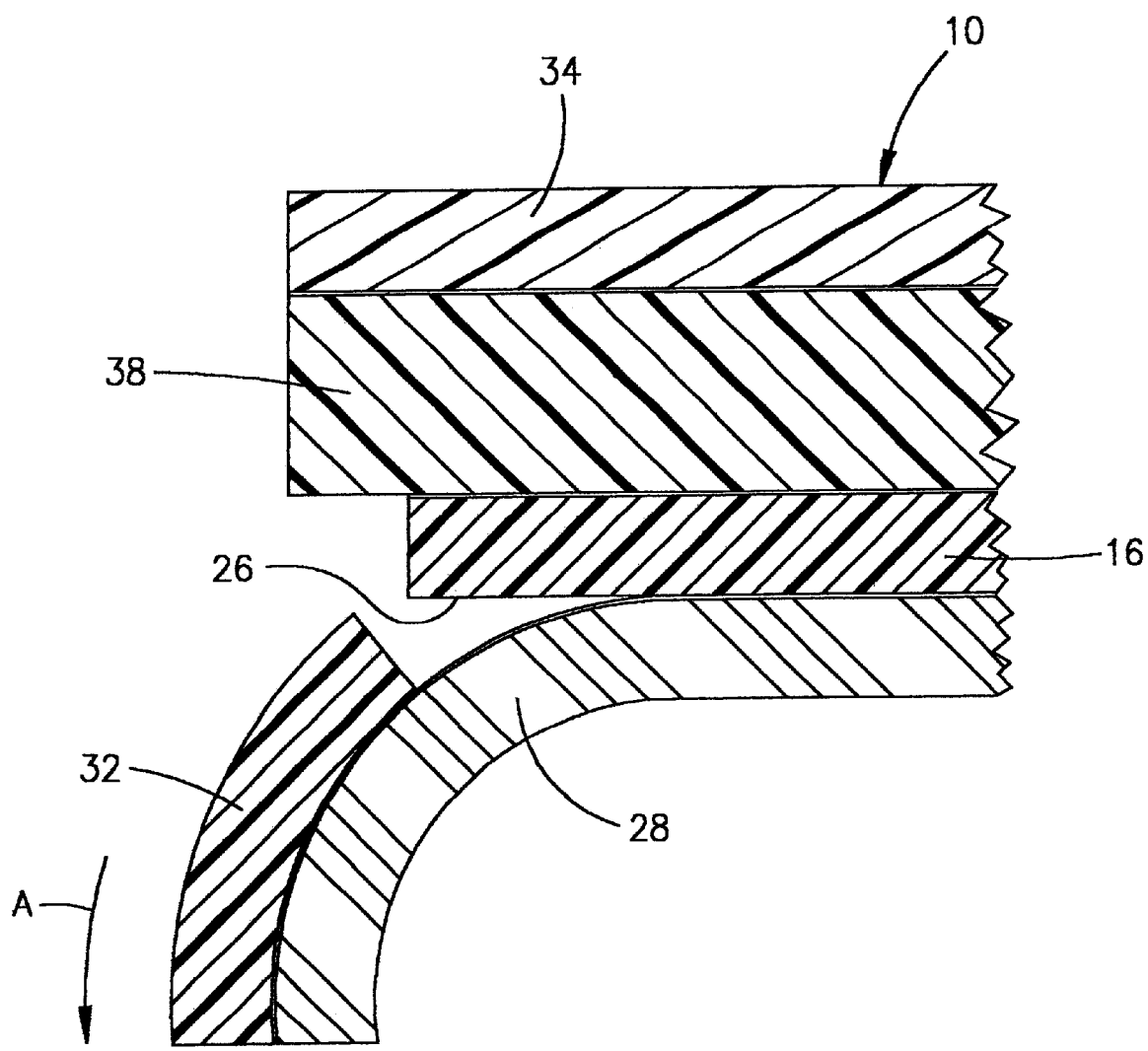
FIG. 8 is an enlarged, fragmented vertical section taken generally along line 8—8 of FIG. 7.

FIGS. 7 and 8 show the laminated circuit assembly comprising circuit sheet 16 and backing sheet 28 used in laminated switch assembly 10 (FIG. 1). More particularly, a switch sheet 34 is adhered, as at 36, to a spacer layer 38 which, in turn, is adhered to a front side of circuit sheet 16, as at 40. In other words, layers 36 and 40 represent films of adhesive between top switch sheet 34, spacer layer 38 and circuit sheet 16.

In laminated switch assembly 10 of FIG. 7, apertures 42 are shown (in phantom) in spacer layer 38 aligned with various contact areas 20 (FIG. 2) of circuitry 18. Corresponding aligned LEDs 44 are supported on the circuit sheet 16. The switch sheet will have various switch contacts (not shown) for engaging contact areas 20 of circuitry 18 through apertures 42 in spacer layer 38 to close switches of the circuitry for operating various components of appliance 14.

When it is desired to apply laminated electrical switch assembly 10 (FIG. 7) to the face of control panel 12 (FIG. 1) of appliance 14, pull tab 32 which is cut from circuit sheet 16 and adhered to backing sheet 28 is pulled downwardly in the direction of arrow "A" as shown in FIGS. 7 and 8. This exposes the adhesive 26 on the back side of circuit sheet 16 after backing sheet 28 is completely stripped from the circuit sheet. The entire laminated switch assembly 10 then can be adhered to the face of control panel 12 of appliance 14 as shown in FIG. 1.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A method of fabricating a laminated circuit assembly for adhering to the face of a control panel of an electrical appliance, comprising the steps of:

provding a plastic circuit sheet with electrical circuitry printed thereon;

cutting a preliminary slit in the circuit sheet in an area where a pull tab subsequently is to be located and depositing an adhesive on a back side of the circuit sheet for subsequent adherence to the face of said control panel;

adhering a backing sheet to the adhesive on the back side of the circuit sheet; and subsequently, cutting the laminated circuit sheet and backing sheet with a peripheral cut around the circuitry, with the peripheral cut intersecting said slit, and with the slit and the peripheral cut together defining an outwardly projecting pull tab which is cut completely out of the circuit sheet;

whereby the pull tab can be grasped and separated from the circuit sheet to strip the backing sheet from the circuit sheet when it is desired to adhere the circuit sheet to the face of said control panel.

2. The method of claim 1 wherein said slit is U-shaped, side legs of the U-shaped configuration defining spaced slit portions and the peripheral cut intersects the side legs of said U-shaped slit.

3. The method of claim 2 wherein said U-shaped slit is cut so that the side legs of the U-shaped configuration project outwardly.

4. The method of claim 1, including adhering a switch sheet to a front side of the circuit sheet.

5. The method of claim 4, including positioning a spacer layer between the switch sheet and the circuit sheet.

6. The method of claim 1, including providing said backing sheet of flexible material.

7. The method of claim 6, including providing said circuit sheet of a material more rigid than the backing sheet.

8. A method of fabricating a laminated circuit assembly, comprising the steps of:

providing a substrate;

cutting a U-shaped slit in the substrate in an area where a peripheral pull tab subsequently is to be located, the side legs of the U-shaped configuration defining spaced slit portions;

thereafter, adhering a relatively flexible backing sheet to a back side of the substrate;

subsequently, cutting the laminated substrate and backing sheet with a peripheral cut intersecting the side legs of the U-shaped slit, and with the U-shaped slit and the peripheral cut together defining an outwardly projecting pull tab which is cut completely out of the circuit sheet;

whereby the pull tab can be grasped and separated from the substrate to strip the backing sheet therefrom.

9. The method of claim 8 wherein said U-shaped slit is cut so that the side legs of the U-shaped configuration project outwardly.

10. The method of claim 8, including adhering a switch sheet to a front side of the circuit sheet.

11. The method of claim 10, including positioning a spacer layer between the switch sheet and the circuit sheet.

12. The method of claim 8, including providing said backing sheet of flexible material.

13. The method of claim 12, including providing said circuit sheet of a material more rigid than the backing sheet.

14. The method of claim 1 in which the slit is essentially continuous and the peripheral cut is essentially continuous.

15. The method of claim 8 in which the U-shaped slit is essentially continuous and the peripheral cut is essentially continuous.

* * * * *